(12) United States Patent
Nakasu et al.

(10) Patent No.: US 9,705,087 B2
(45) Date of Patent: *Jul. 11, 2017

(54) ORGANIC LIGHT EMITTING DEVICE

(71) Applicant: CANON KABUSHIKI KAISHA, Tokyo (JP)

(72) Inventors: Minako Nakasu, Tokyo (JP); Masataka Yashima, Tokyo (JP); Hajime Muta, Zama (JP); Keiji Okinaka, Kawasaki (JP); Tomona Yamaguchi, Tokyo (JP); Tomonari Horikiri, Sagamihara (JP); Maki Okajima, Kawasaki (JP); Naoki Yamada, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/053,528

(22) Filed: Feb. 25, 2016

(65) Prior Publication Data

US 2016/0181528 A1 Jun. 23, 2016

Related U.S. Application Data

(63) Continuation of application No. 13/501,123, filed as application No. PCT/JP2010/072061 on Dec. 2, 2010, now Pat. No. 9,312,494.

(30) Foreign Application Priority Data

Dec. 14, 2009 (JP) ................ 2009-282648

(51) Int. Cl.
| | |
|---|---|
| H01L 51/54 | (2006.01) |
| C09K 11/06 | (2006.01) |
| H01L 51/00 | (2006.01) |
| H01L 51/50 | (2006.01) |
| H05B 33/14 | (2006.01) |
| C09K 11/02 | (2006.01) |
| G03G 15/04 | (2006.01) |
| H01L 27/32 | (2006.01) |

(52) U.S. Cl.
CPC .......... *H01L 51/006* (2013.01); *C09K 11/025* (2013.01); *C09K 11/06* (2013.01); *G03G 15/04036* (2013.01); *H01L 27/3244* (2013.01); *H01L 51/0054* (2013.01); *H01L 51/0058* (2013.01); *H01L 51/0059* (2013.01); *H01L 51/5048* (2013.01); *H05B 33/14* (2013.01); *C09K 2211/1007* (2013.01); *C09K 2211/1011* (2013.01); *C09K 2211/1014* (2013.01); *H01L 51/0052* (2013.01); *H01L 51/506* (2013.01); *H01L 51/5012* (2013.01); *H01L 51/5016* (2013.01); *H01L 2251/308* (2013.01)

(58) Field of Classification Search
CPC .................. H05B 33/14; C09K 11/06; C09K 2211/1007; C09K 2211/1011; C07C 13/567; C07C 2103/18; C07C 211/00; C07C 211/33; C07C 211/34; C07C 211/43; C07C 211/54; C07C 211/55; C07C 211/57; C07C 211/61; H01L 51/0032; H01L 51/005; H01L 51/0059; H01L 51/006; H01L 51/50; H01L 51/5004; H01L 51/5048; H01L 51/5052; H01L 51/5056
USPC ....... 428/690, 691, 417, 311.1, 917; 427/58, 427/66; 313/500–512; 257/40, 88–104, 257/E51.001–E51.052, E27.119; 252/301.16–301.35
See application file for complete search history.

(56) References Cited

U.S. PATENT DOCUMENTS

| | | | |
|---|---|---|---|
| 7,538,487 B2 | 5/2009 | Hasegawa et al. | |
| 7,604,873 B2 | 10/2009 | Okinaka et al. | |
| 7,919,199 B2 | 4/2011 | Okinaka et al. | |
| 8,354,788 B2 | 1/2013 | Okinaka et al. | |
| 9,312,494 B2 * | 4/2016 | Nakasu ................. | C09K 11/06 |
| 2004/0185300 A1 | 9/2004 | Hatwar et al. | |
| 2008/0268285 A1 | 10/2008 | Okinaka et al. | |
| 2009/0066227 A1 | 3/2009 | Okinaka et al. | |

(Continued)

FOREIGN PATENT DOCUMENTS

| | | |
|---|---|---|
| JP | 2000-68064 A | 3/2000 |
| JP | 2006-278918 A | 10/2006 |
| JP | 2007-100083 A | 4/2007 |
| JP | 2008-270674 A | 11/2008 |
| JP | 2009-277984 A | 11/2009 |

(Continued)

OTHER PUBLICATIONS

Japanese Office Action issued in counterpart application No. 2009-282648 dated Nov. 5, 2013, along with its English-language translation—7 pages.

(Continued)

*Primary Examiner* — Andrew K Bohaty
(74) *Attorney, Agent, or Firm* — Fitzpatrick, Cella, Harper & Scinto

(57) ABSTRACT

Provided is an organic light emitting device with enhanced durability during continuous driving. The organic light emitting device includes: an anode, a cathode, and an organic compound layer being placed between the anode and the cathode and including at least a hole transport layer and an emission layer, in which: the emission layer contains a blue light emitting material; the hole transport layer contains a plurality of kinds of organic compounds; and an organic compound having the smallest ionization potential among the organic compounds includes a compound having no absorption spectrum peak in a blue color wavelength region in a radical cation state.

9 Claims, 3 Drawing Sheets

(56) References Cited

U.S. PATENT DOCUMENTS

| | | |
|---|---|---|
| 2010/0327274 A1 | 12/2010 | Okajima et al. |
| 2011/0001864 A1 | 1/2011 | Okinaka et al. |
| 2011/0089822 A1 | 4/2011 | Okinaka et al. |
| 2011/0204349 A1 | 8/2011 | Okajima et al. |
| 2011/0233525 A1 | 9/2011 | Terao et al. |

FOREIGN PATENT DOCUMENTS

| | | |
|---|---|---|
| JP | 2009-302516 A | 12/2009 |
| WO | 2009/069434 A1 | 6/2009 |
| WO | 2009/139501 A1 | 11/2009 |

OTHER PUBLICATIONS

Chinese Office Action and English translation issued in corresponding application No. 201080055974.X dated Dec. 26, 2014—17 pages.

Chinese Office Action issued in counterpart application No. 201080055974.X dated Apr. 21, 2014, along with its English-language translation—14 pages.

Korean Office Action issued in counterpart application No. 10-2012-7017690 dated Apr. 22, 2014, along with its English-language translation—8 pages.

Korean Office Action issued in counterpart application No. 10-2014-7023485 dated Jul. 31, 2015 along with its English-language translation—9 pages.

Korean Office Action issued in counterpart application No. 10-2012-7017690 dated Sep. 25, 2013, along with its English-language translation—7 pages.

Japanese Office Action issued in correspondence application No. 2009-282648 dated Sep. 2, 2014—9 pages with English translation.

Machine translation of JP 2008-270674. Date of publication: Nov. 6, 2008.

Machine translation of JP 2009-277984. Date of publication: Nov. 26, 2009.

H. Aziz et al., "Degradation Mechanism of Small Molecule-Based Organic Light-Emitting Devices", Science, vol. 283, No. 5409, pp. 190-1902 (1999).

Extended European Search Report dated Jan. 5, 2017, issued in counterpart application EP 10837490.1 (7 pages).

\* cited by examiner

ORGANIC LIGHT EMITTING DEVICE

The present application is a continuation of U.S. application Ser. No. 13/501,123, filed on Apr. 10, 2012, which is a national phase entry of PCT/JP2010/072601 filed on Dec. 2, 2010, which claims priority to JP 2009-282648 filed Dec. 14, 2009, the entire disclosure of each of which is incorporated by reference herein.

TECHNICAL FIELD

The present invention relates to an organic light emitting device.

BACKGROUND ART

An organic light emitting device is an electronic device in which a thin film containing a fluorescent organic compound or a phosphorescent organic compound is interposed between an anode and a cathode. In the organic light emitting device, holes and electrons are injected from each electrode to the thin film containing a fluorescent organic compound or a phosphorescent organic compound. When the holes and electrons are recombined in the thin film, excitons of the fluorescent compound or the phosphorescent compound are generated. When the excitons return to a ground state, the organic light emitting device emits light.

The recent advance in the organic light emitting device is remarkable, and the organic light emitting device can serve as a light emitting device with high luminance at a low applied voltage, various emission wavelengths, high-speed responsiveness, small thickness, and light weight. This suggests that the organic light emitting device may be used for a wide range of applications such as a flat panel display, a flexible display, and illumination.

However, when the organic light emitting device is driven continuously, constituent materials for the organic light emitting device are degraded with time, for example, by being combined with electrons or holes, and hence, the emission intensity of the organic light emitting device decreases with time.

The research and development for alleviating the decrease with time in characteristics such as emission intensity of the organic light emitting device during continuous driving have been conducted conventionally. Japanese Patent Application Laid-Open No. 2000-068064 discloses an organic light emitting device in which a hole transport layer is formed of at least two kinds of organic materials so as to enhance the durability of the organic light emitting device. Specifically, the patent document discloses an embodiment in which the hole transport layer contains at least two kinds of organic materials that are different in durability. This can prevent the crystallization and the growth of dark spots in an organic compound layer, particularly, the hole transport layer, and hence, the durability of the device is enhanced.

Meanwhile, Science, 283, 1900 (1999) mentions that an organic compound forming the organic light emitting device repeatedly undergoes oxidation and reduction caused by the current conduction through the device to decrease the emission intensity of the device. The above document also discusses that the decrease in emission intensity of the device is caused when a particular organic compound is oxidized, that is, enters a radical cation state. Specifically, the document suggests that, when the device is driven, tris(8-quinolinolato)aluminum ($Alq_3$) incorporates holes to enter a radical cation state, which is one cause of the decrease in emission intensity of the device.

Considering the above-mentioned technical background, the inventors of the present invention discussed that an organic compound contained in a hole transport layer is involved in the decrease with time in emission intensity of the organic light emitting device as one cause. The hole transport layer is supplied with holes that are charge carriers from an anode. Therefore, the prevention of the structural change in the organic compound contained in the hole transport layer is important from the viewpoint of alleviating the decrease with time in characteristics such as emission intensity of the organic light emitting device during continuous driving.

SUMMARY OF INVENTION

Technical Problem

The present invention has been achieved in order to solve the above-mentioned problem, and an object of the present invention is to provide an organic light emitting device with enhanced durability during continuous driving.

The present invention provides an organic light emitting device, including: an anode, a cathode, and an organic compound layer being placed between the anode and the cathode and including at least a hole transport layer and an emission layer, in which: the emission layer contains a blue light emitting material; the hole transport layer contains a plurality of kinds of organic compounds; and an organic compound having the smallest ionization potential among the organic compounds includes a compound having no absorption spectrum peak in a blue color wavelength region in a radical cation state.

DESCRIPTION OF EMBODIMENTS

Figure 1:
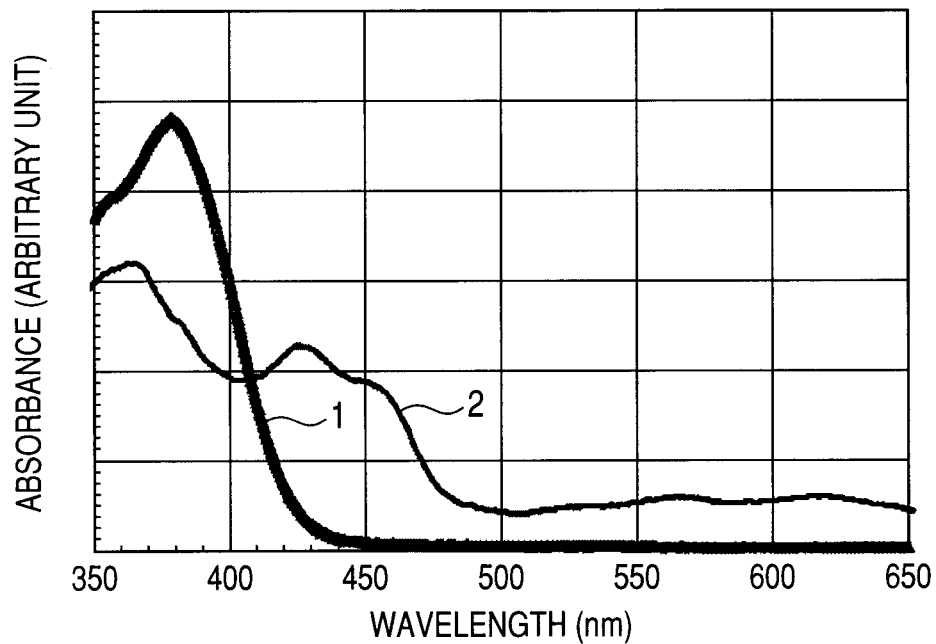
FIG. 1 is a diagram illustrating UV-visible absorption spectra of Compound 2 in a neutral state and a radical cation state.

The organic light emitting device of the present invention includes an anode and a cathode, and an organic compound layer that is placed between the anode and the cathode and includes at least a hole transport layer and an emission layer. In the present invention, as long as the organic compound layer includes a hole transport layer and an emission layer, there is no particular limit to the layer configuration of the organic compound layer. The specific configuration of the organic light emitting device of the present invention is described below. The configurations listed below are specific examples, which do not limit the present invention.

(A) (Substrate/)anode/hole transport layer/emission layer/cathode (B) (Substrate/)anode/hole transport layer/emission layer/electron transport layer/cathode (C) (Substrate/)anode/hole injection layer/hole transport layer/emission layer/electron transport layer/cathode
(D) (Substrate/)anode/hole transport layer/emission layer/electron transport layer/electron injection layer/cathode
(E) (Substrate/)anode/hole transport layer/emission layer/hole/exciton blocking layer/electron transport layer/cathode
(F) (Substrate/)anode/hole injection layer/hole transport layer/emission layer/hole/exciton blocking layer/electron transport layer/cathode
(G) (Substrate/)anode/hole transport layer/emission layer/hole/exciton blocking layer/electron transport layer/electron injection layer/cathode
(H) (Substrate/)anode/hole transport layer/electron/exciton blocking layer/emission layer/electron transport layer/cathode
(I) (Substrate/)anode/hole injection layer/hole transport layer/electron/exciton blocking layer/emission layer/hole/exciton blocking layer/electron transport layer/cathode
(J) (Substrate/)anode/hole transport layer/electron/exciton blocking layer/emission layer/electron transport layer/electron injection layer/cathode
(K) (Substrate/)anode/hole injection layer/hole transport layer/emission layer/electron transport layer/electron injection layer/cathode In the present invention, the emission layer forming the device contains a blue light emitting material. Here, the blue light emitting material refers to a light emitting organic compound having an emission spectrum peak within the range of 410 nm to 490 nm.

In the present invention, the hole transport layer forming the device contains a plurality of kinds (at least two kinds) of organic compounds. Preferably, the hole transport layer contains two to three kinds of organic compounds. Here, the organic compounds contained in the hole transport layer are those which are different in ionization potential. In the case where the hole transport layer contains at least three kinds of organic compounds, parts of the organic compounds contained in the hole transport layer may have the same ionization potential.

Further, in the present invention, an organic compound having the smallest ionization potential among the organic compounds contained in the hole transport layer is a compound having no absorption spectrum peak in a blue color wavelength region in a radial cation state. Here, a small ionization potential refers to an ionization potential having a small absolute value, and also refers to closeness to a vacuum level, i.e., a shallow ionization potential.

The hole transport layer is required to have hole transporting property necessary for realizing the reduction in driving voltage of the organic light emitting device, and a function of controlling the charge balance for confining electrons in the emission layer while injecting holes into the emission layer to enhance the recombination probability of charge carriers in the emission layer. It is ideal that the organic compound have no absorption peak in a blue color wavelength region in a radical cation state while having the above-mentioned property and function. However, in the present circumstance, no organic compounds satisfying both the conditions have been found.

In the present invention, as the hole transport layer contains a plurality of kinds of organic compounds that are different in ionization potential, holes can be collected in the organic compound having the smallest ionization potential. This can prevent the holes from being collected in the organic compounds other than the organic compound having the smallest ionization potential (hereinafter, referred to as "other organic compounds"). Further, the amount of holes can be suppressed, which are accumulated in the hole transport layer without being supplied to the emission layer due to the unnecessary generation of molecules in a radical cation state caused by the collection of the holes in the "other organic compounds". Thus, even if the "other organic compounds" enter an excited state, this state is not considered as the one in radical cations.

Further, in the present invention, the organic compound having the smallest ionization potential contained in the hole transport layer is an organic compound having no absorption peak in a blue color wavelength region in a radical cation state. Here, having an absorption peak in a blue color wavelength region refers to that an excited state is present in energy corresponding to the blue color wavelength region (relative energy to a ground state with zero energy). On the other hand, in the present invention, having no absorption peak in a blue color wavelength region refers to that the mol absorptivity coefficient of a blue color wavelength region of a target organic compound in a radial cation state is 5000 L/(mol·cm) or less. As the absorption peak can be confirmed from the waveform of a UV-visible absorption spectrum, it can be determined whether or not there is an absorption peak in the blue color wavelength region from the peak wavelength of the spectrum. In this case, the absorption spectrum has any shape.

In the present invention, it is preferred that the mol absorptivity coefficient in the blue color wavelength region of the organic compound having the smallest ionization potential be 5000 $L \cdot mol^{-1} \cdot cm^{-1}$ or less.

This can prevent the structure of a target organic compound from being changed by a blue emission from the emission layer in a radical cation state. In the above-mentioned "other organic compounds" contained in the hole transport layer, there is no particular limit to the mol absorptivity coefficient in a radical cation state. That is, the mol absorptivity coefficient may be 5000 L/(mol·cm) or less or may exceed this value.

As described above, according to the present invention, the durability of the organic light emitting device during continuous driving is enhanced.

In the present invention, a compound having the smallest ionization potential contained in the hole transport layer preferably has a low concentration in the hole transport layer, and specifically, the concentration is 30% by weight or less with respect to the entire layer. When the concentration exceeds 30% by weight, the function of the hole transport layer may change largely. Further, in order to prevent the decrease in emission intensity of the organic light emitting device, the concentration of the compound having the lowest ionization potential contained in the hole transport layer is more preferably 5% by weight or more to 30% by weight or less. When the concentration is too low (less than 5% by weight), the above-mentioned "other organic compounds" may enter a radical cation state.

Further, the organic compound having the smallest ionization potential may be contained uniformly in the hole transport layer or may be present only in a predetermined region. Further, the concentration of the organic compound having the smallest ionization potential may be changed into a thickness direction of the hole transport layer.

The organic compound having the smallest ionization potential is preferably a compound represented by the following general formula (1):

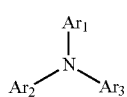

(1)

where $Ar_1$ to $Ar_3$ each represent a fused polycyclic aromatic group or a substituted phenyl group represented by the following general formula (2):

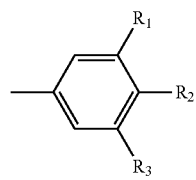

(2)

provided that each of $Ar_1$ to $Ar_3$ may be the same as or different from the other substituents, where: $R_1$ and $R_3$ each represent a hydrogen atom, a halogen atom, a substituted or unsubstituted alkyl group, or a substituted or unsubstituted aryl group, provided that any one of $R_1$ and $R_3$ represents a substituted or unsubstituted aryl group; and $R_2$ represents a hydrogen atom, a halogen atom, or a substituted or unsubstituted alkyl group.

First, a tertiary arylamine represented by the general formula (1) is described.

Examples of the fused polycyclic aromatic group represented by each of $Ar_1$ to $Ar_3$ include, but are not limited to, a naphthyl group, a naphthyl-$d_7$ group, an acenaphthylenyl group, an anthryl group, an anthryl-$d_9$ group, a phenanthryl group, a phenanthryl-$d_9$ group, a pyrenyl group, a pyrenyl-$d_9$ group, an acephenanthrylenyl group, an aceanthrylenyl group, a chrysenyl group, a dibenzochrysenyl group, a benzoanthryl group, a benzoanthryl-$d_{11}$ group, a dibenzoanthryl group, a naphthacenyl group, a picenyl group, a pentacenyl group, a fluorenyl group, a 9,9-dimethylfluorenyl group, a triphenylenyl group, a perylenyl group, and a perylenyl-$d_{11}$ group.

Next, the substituted phenyl group represented by each of $Ar_1$ to $Ar_3$ in the general formula (1) and represented by the general formula (2) is described.

Examples of the halogen atom represented by each of $R_1$ and $R_3$ include fluorine, chlorine, bromine, and iodine.

Examples of the substituted or unsubstituted alkyl group represented by each of $R_1$ and $R_3$ include, but are not limited to, a methyl group, a methyl-$d_1$ group, a methyl-$d_3$ group, an ethyl group, an ethyl-$d_5$ group, an n-propyl group, an n-butyl group, an n-pentyl group, an n-hexyl group, an n-heptyl group, an n-octyl group, an n-decyl group, an iso-propyl group, an iso-propyl-$d_7$ group, an iso-butyl group, a sec-butyl group, a tert-butyl group, a tert-butyl-$d_9$ group, an iso-pentyl group, a neopentyl group, a tert-octyl group, a fluoromethyl group, a difluoromethyl group, a trifluoromethyl group, a 2-fluoroethyl group, a 2,2,2-trifluoroethyl group, a perfluoroethyl group, a 3-fluoropropyl group, a perfluoropropyl group, a 4-fluorobutyl group, a perfluorobutyl group, a 5-fluoropentyl group, a 6-fluorohexyl group, a chloromethyl group, a trichloromethyl group, 2-chloroethyl group, a 2,2,2-trichloroethyl group, a 4-chlorobutyl group, a 5-chloropentyl group, a 6-chlorohexyl group, a bromomethyl group, a 2-bromoethyl group, an iodomethyl group, a 2-iodoethyl group, a hydroxymethyl group, a hydroxyethyl group, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a norbornyl group, and an adamantyl group.

Examples of the substituted or unsubstituted aryl group represented by each of $R_1$ and $R_3$ include, but are not limited to, a phenyl group, a phenyl-$d_5$ group, a 4-methylphenyl group, a 4-methoxyphenyl group, a 4-ethylphenyl group, a 4-fluorophenyl group, a 4-trifluorophenyl group, a 3,5-dimethylphenyl group, a 2,6-diethylphenyl group, a mesityl group, a 4-tert-butylphenyl group, a ditolylaminophenyl group, a biphenyl group, a terphenyl group, a naphthyl group, a naphthyl-$d_7$ group, an acenaphthylenyl group, an anthryl group, an anthryl-$d_9$ group, a phenanthryl group, a phenanthryl-$d_9$ group, a pyrenyl group, a pyrenyl-$d_9$ group, an acephenanthrylenyl group, an aceanthrylenyl group, a chrysenyl group, a dibenzochrysenyl group, a benzoanthryl group, a benzoanthryl-$d_{11}$ group, a dibenzoanthryl group, a naphthacenyl group, a picenyl group, a pentacenyl group, a fluorenyl group, a triphenylenyl group, a perylenyl group, a perylenyl-$d_{11}$ group, and a substituent represented below.

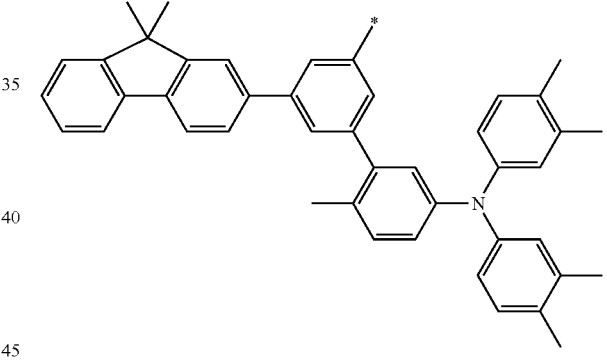

(* represents a bond)

It is preferred that the organic compound having the smallest ionization potential contained in the hole transport layer have a molecular structure in which electrons are not distributed throughout molecules. When the organic compound having the smallest ionization potential has the molecular structure in which electrons are not distributed throughout molecules, the organic compound has no absorption peak in a blue color wavelength region in a radical cation state. Therefore, the organic compound having the smallest ionization potential is not excited with a blue emission and can be suppressed from being changed into structure by a blue emission.

A specific example of a compound capable of preventing electrons from being distributed throughout molecules includes a tertiary arylamine derivative excellent in hole transporting ability. In particular, the compound of the general formula (1) is preferred because the compound is expected to have a twisted structure in which electrons are not distributed throughout molecules.

The tertiary arylamine derivative of the general formula (1) is a compound having a relatively large molecular weight as is understood from the above-mentioned contents of $Ar_1$ to $Ar_3$, and the molecular weight thereof is preferably 1500 or less so as to enable the formation of a thin film by vacuum deposition.

Further, it is preferred to introduce a substituted or unsubstituted aryl group into any one of $R_1$ and $R_3$ (meta-position) in the general formula (2), because the introduction of such group can reduce the crystallinity of molecules. Meanwhile, it is also preferred to introduce an alkyl group or a halogen atom into $R_2$ in the general formula (2), because HOMO can be changed more largely compared with the case where $R_2$ represents a hydrogen atom. Specifically, the introduction of an alkyl group can make HOMO shallow, whereas the introduction of a halogen atom can make HOMO deep. It is recommended that no aryl group be introduced into $R_2$ in the general formula (2). This is because electrons may be distributed in a wider range by the introduction of an aryl group into the position of $R_2$.

Specific examples of the compound represented by the general formula (1) are listed below. It should be noted that the present invention is not limited to the examples.

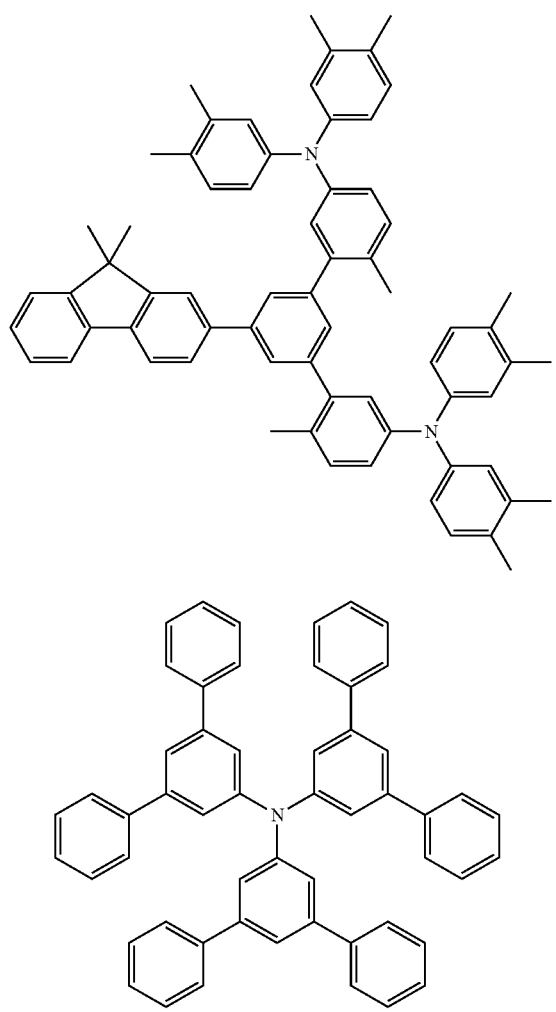

-continued

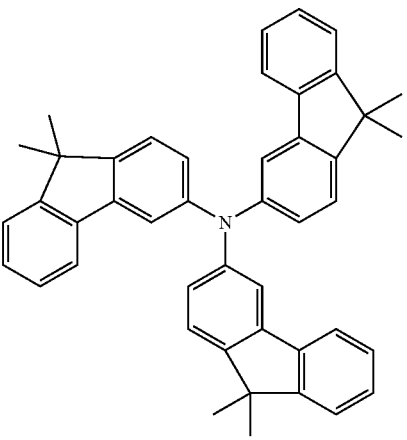

The specific structure of compounds corresponding to the above-mentioned "other organic compounds" among the organic compounds contained in the hole transport layer is not particularly limited. Of those, a triphenylamine derivative is preferred.

The inventors of the present invention have paid attention to the fact that, when the constituent materials for the hole transport layer are bound to holes to enter a radical cation state, the constituent materials are excited upon receiving energy such as light.

It is considered that, when being excited, the constituent materials for the hole transport layer undergo an irreversible reaction to cause a change in structure. Although the specific aspect of the change in structure is not clear, it is considered that a change in molecular structure is caused by a cleavage reaction, a decomposition reaction, an addition reaction, etc. The change in molecular structure leads to changes in carrier transporting property and conduction level (energy level during carrier transportation expressed by HOMO/LUMO, etc.). Then, the carrier balance in the emission layer is lost, which causes a decrease in recombination probability of holes and electrons in the emission layer. Further, the above-mentioned molecules (constituent materials) in an excited state function as a quencher for light emitting molecules, which also causes a decrease in emission intensity.

When the organic light emitting device is driven, holes supplied from an anode are supplied to the emission layer through the hole transport layer. On the other hand, electrons supplied from a cathode are supplied to the emission layer through the electron transport layer. Here, compounds serving as constituent materials for the hole transport layer are combined with or dissociated from the holes repeatedly. This means that oxidation and reduction are repeated electrochemically, which results in the repetition of a radical cation state and a neutral state. That is, when a current is applied to the device, a number of organic compounds in a radical cation state are present in the hole transport layer. It is considered that, when the organic compound in a radical cation state further receives energy such as light to enter an excited state, the structure of the compound itself changes. This decreases the durability of the organic light emitting device during continuous driving.

As energy considered to be received by the organic compound in a radical cation state, for example, the following two energies are considered.

One of them is excitation energy of constituent materials of the emission layer such as a light emitting material. As the hole transport layer is adjacent to the emission layer in most cases, when the emission layer is emitting light, a part of the excitation energy of the constituent materials for the emission layer may undergo energy movement to the hole transport layer. Specifically, this is Foerster-type energy movement from a singlet excited state.

The other of them is light energy of a blue emission emitted from the emission layer. The compound in a radical cation state can be excited by absorbing the light.

Both the energies are derived from the emission of the organic light emitting device and influence the organic compound in a radical cation state. In particular, the first one is considered to be dominant in view of the efficiency of the energy transmission.

It is considered that the organic compound in a radical cation state is relatively stable, but when the organic compound in a radical cation state further receives energy to enter an excited state, the organic compound becomes unstable to undergo a change in structure.

As described above, in order to prevent a change in structure of the organic compound contained in the hole transport layer during the current conduction, it is necessary that the organic compound which is likely to receive holes be a compound having no absorption peak in a blue color wavelength region in a radical cation state. A method of eliminating molecules in a radical cation state in the hole transport layer is also considered. However, in consideration of the function of the hole transport layer of transporting holes, the method cannot be employed.

In view of the foregoing, in the present invention, as a plurality of kinds of organic compounds contained in the hole transport layer, particularly, an organic compound that is likely to receive holes, an organic compound that has no absorption peak in a blue color wavelength region when receiving holes to enter a radical cation state is selected.

Consequently, an organic compound that is likely to receive holes does not undergo a change in structure due to a blue emission output from the emission layer. In addition, a change in structure of the organic compound that is likely to receive holes caused by the accumulation of unnecessary holes can be prevented.

As described above, when the organic compound in a radical cation state is excited with light emitted from the emission layer, the emission intensity of the organic compound is decreased actually.

For example, it is assumed that there is an organic light emitting device having a configuration shown in the following table on a substrate (note that the configuration is described in accordance with the order of lamination on the substrate).

TABLE 1

| Anode | Indium tin oxide (ITO) |
| --- | --- |
| First organic compound layer | Compound 1 (90% by weight) |
| | Compound 2 (10% by weight) |
| Second organic compound layer | Compound 3 |
| Cathode | Aluminum |

The above-mentioned Compounds 1 to 3 are ones which are shown below. Further, the organic light emitting device in the above-mentioned table is covered with a protective glass plate and sealed with an epoxy-based adhesive in a nitrogen atmosphere at a dew point of −70° C. or less so that the device does not adsorb moisture.

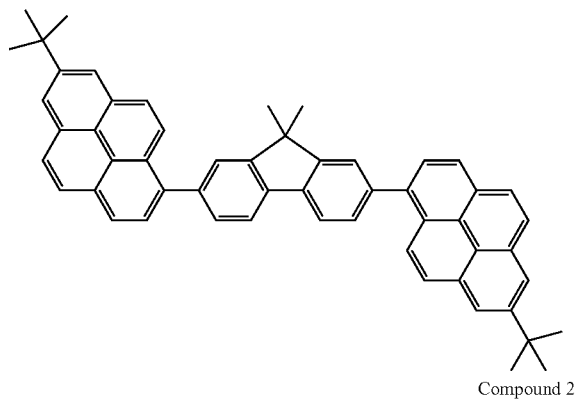

Compound 1

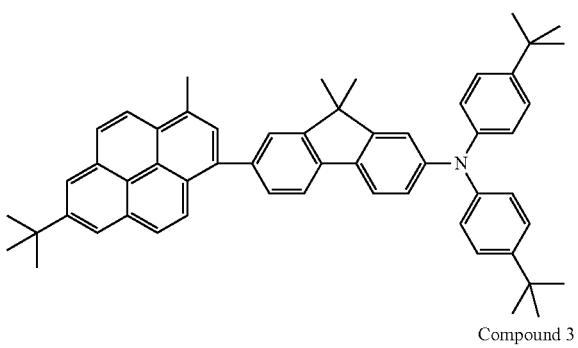

Compound 2

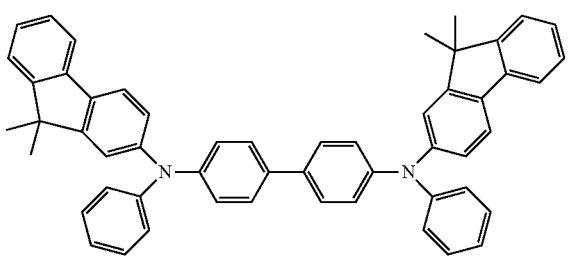

Compound 3

When a voltage is applied to the organic light emitting device, as the electron affinity of Compound 3 is small, electrons are not injected from the cathode to the second organic compound layer, whereas holes are injected from the anode to the second organic compound layer. Thus, only a hole current passes through the organic light emitting device. Accordingly, even when an electric current is allowed to pass through this sample, EL emission does not occur.

In the organic light emitting device, the photoluminescence of the first organic compound layer under the following conditions is measured. Each of the following conditions (i) to (iii) is conducted for 130 hours.

(i) A voltage is applied while a current density is kept at 100 mA/cm$^2$.

(ii) Light having a wavelength of 460 nm is irradiated.

(iii) Light having a wavelength of 460 nm is irradiated while a voltage is applied with a current density kept at 100 mA/cm$^2$.

The following table shows the measurement results of the photoluminescence. Further, regarding the conditions (i) and (iii), the results of voltage changes are also shown.

TABLE 2

| | Photoluminescence (Note 1) | Voltage change (Note 2) |
|---|---|---|
| (i) | 99% | +1 V |
| | 99% | – |
| (ii) | 92% | +14 V |

(Note 1) Photolumiescence intensity after current conduction and/or light irradiation with respect to that before current conduction and/or light irradiation. The time for each of current conduction and light irradiation is 130 hours.

(Note 2) The voltage at the beginning of current conduction and/or light irradication is about 21 V.

Meanwhile, for the purpose of discussing the results in Table 2 above, the UV-visible absorption spectrum of a thin film of Compound 2 is also measured. FIG. 1 illustrates UV-visible absorption spectra in a neutral state and a radical cation state. The neutral state as used herein refers to a state in which the thin film of Compound 2 is not bound to cations, i.e., the state in which a voltage is not applied to the organic light emitting device. On the other hand, the radical cation state as used herein refers to a state in which the thin film of Compound 2 is bound to cations, i.e., the state in which a voltage is applied to the organic light emitting device.

Referring also to FIG. 1, the results shown in Table 2 suggest that the radical cations of Compound 2 generated by the current conduction through the holes are excited with blue light having a wavelength of 460 nm, resulting in a change in structure. Compound 2 has relatively small absorption in a blue color wavelength region in a neutral state (spectrum 1 in FIG. 1) and has a large energy gap, and hence cannot be excited with blue light having a wavelength of about 460 nm. However, when entering a radical cation state (spectrum 2 in FIG. 1), Compound 2 in a radical cation state is excited with blue light having a wavelength of about 460 nm because the compound has an absorption peak in a blue color wavelength region. Compound 2 enters a radical cation state preferentially because Compound 2 has an ionization potential smaller than that of Compound 1.

The above-mentioned results suggest that the absorption spectrum of radical cations generated by the current conduction through the holes can change the characteristics of the device.

Regarding the above-mentioned change in device characteristics in the organic light emitting device, excitation energy required for an emission, which may flow out of the emission layer, should be considered. This is because the efficiency of Foerster movement type energy transmission is remarkably larger than that of light absorption.

In the present invention, the emission layer may be formed of only an organic compound emitting blue light or may be formed of a host and a guest. In the case where the emission layer is formed of a host and a guest, the host and the guest can be discriminated from each other by a content in the emission layer such as a weight ratio (% by weight). In this case, the guest is a material that determines the color of an emission output from the emission layer. In the case where the emission layer is formed of a host and a guest, a material such as a so-called assist dopant that further facilitates the energy movement from the host to the guest, for example, may be further added, in addition to the host and the guest.

In the present invention, in the case where another layer is provided as the layer forming the organic compound layer, in addition to the hole transport layer and the emission layer, know materials can be used as the constituent materials for another layer (a hole injecting/transporting material, an electron injecting/transporting material, and a light emitting material). Further, in the present invention, as constituent materials for the electrodes (an anode and a cathode), known materials (a metal material, an alloy, a metal compound, etc.) can be used.

The organic light emitting device of the present invention can be used as, for example, a pixel portion of a display apparatus, a light source for forming a latent image of a photosensitive body of an electrophotographic image forming apparatus, or a display portion of an imaging apparatus having an imaging optical system.

In the case of using the organic light emitting device of the present invention as a member of a display apparatus, the display apparatus includes pixels having the organic light emitting device of the present invention and a TFT circuit that controls the luminance of the organic light emitting device of the present invention.

EXAMPLES

Synthesis Example 1

Synthesis of Exemplary Compound 1

Exemplary compound 1 was synthesized by the following synthesis scheme.

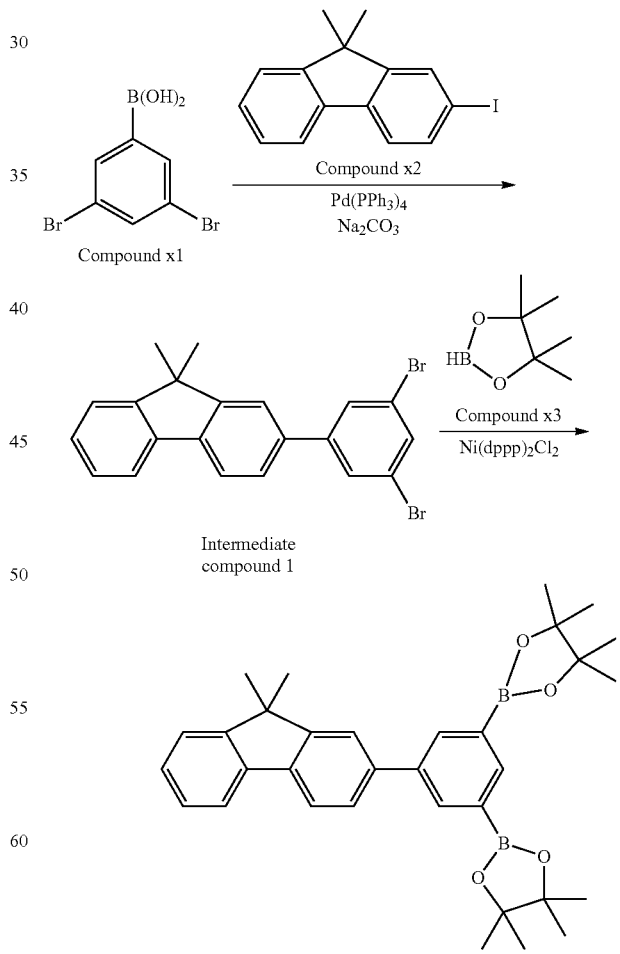

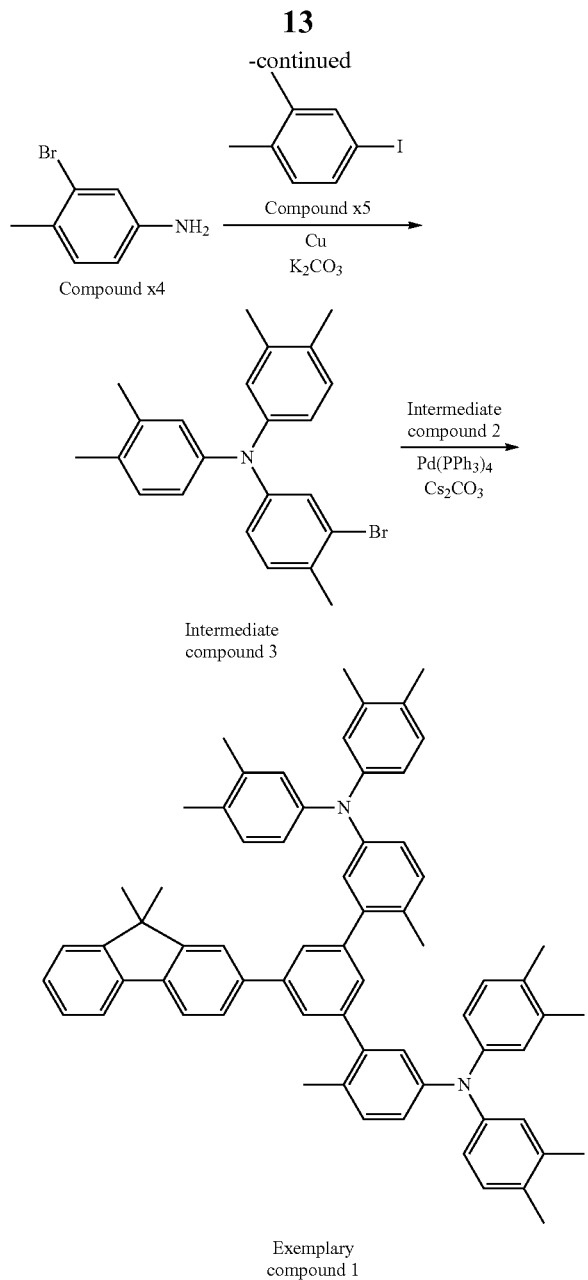

(1) Synthesis of Intermediate Compound 1

The following reagents and solvents were charged into a 300-ml three-necked flask.

Compound x1: 10 g (36.2 mmol)
Compound x2: 14.98 g (47.1 mmol)
Toluene: 120 ml
Ethanol: 20 ml Next, after the atmosphere in the reaction system was replaced with nitrogen, an aqueous solution of a mixture of 10 g of sodium carbonate and 100 ml of water was dropped to the reaction solution with stirring at room temperature, and then, 2.00 g (1.70 mmol) of tetrakis(triphenylphosphine)palladium(0) were added to the solution. Then, the reaction solution was heated to 77° C. and stirred at this temperature (77° C.) for 5 hours. After the completion of the reaction, an organic layer was extracted with toluene and dried over anhydrous sodium sulfate, and thereafter, the solvent was distilled off under reduced pressure to afford a crude product. Next, the crude product was purified by silica gel column chromatography (developing solvent: heptane/toluene mixed solvent) to afford 9.84 g (yield: 64.1%) of Intermediate compound 1 as a white solid.

(2) Synthesis of Intermediate Compound 2

The following reagent and solvents were charged into a 300-ml three-necked flask.

Intermediate compound 1: 8.0 g (18.9 mmol)
Toluene: 120 ml
Triethylamine: 40 ml

Subsequently, Compound x3 (11.0 ml) was added dropwise. Next, after the atmosphere in the reaction system was replaced with nitrogen, 1.08 g (2.0 mmol) of [1,3-bis(diphenylphosphino)propane]nickel(II) dichloride were added to the reaction solution with stirring at room temperature. Then, the reaction solution was heated to 90° C. and stirred at this temperature (90° C.) for 8 hours. After the completion of the reaction, an organic layer was extracted with toluene and dried over anhydrous sodium sulfate, and thereafter, the solvent was distilled off under reduced pressure to afford a crude product. Next, the crude product was purified by silica gel column chromatography (developing solvent: heptane/toluene mixed solvent) to afford 5.25 g (yield: 53.4%) of Intermediate compound 2 as a yellowish-white solid.

(3) Synthesis of Intermediate Compound 3

The following reagents and solvent were charged into a 200-ml three-necked flask.

Compound x4: 5.0 g (26.9 mmol)
Compound x5: 25 g (108 mmol)
Copper powder: 7.0 g (110 mmol)
Potassium carbonate: 20.73 g (150 mmol)
o-Dichlorobenzene: 100 ml Next, the reaction solution was heated to 165° C. and stirred at this temperature (165° C.) for 8 hours. After the completion of the reaction, the reaction solution was filtered, and the filtrate was concentrated under reduced pressure to afford a crude product. Then, the crude product was purified by silica gel column chromatography (developing solvent: heptane/toluene mixed solvent) to afford 9.07 g (yield: 86.0%) of Intermediate compound 3 as a white solid.

(4) Synthesis of Exemplary Compound 1

The following reagents and solvent were charged into a 200-ml three-necked flask.

Intermediate compound 2: 0.78 g (1.5 mmol)
Intermediate compound 3: 1.47 g (3.75 mmol)
Toluene: 50 ml
Ethanol: 10 ml Next, after the atmosphere in the reaction system was replaced with nitrogen, an aqueous solution of a mixture of 10 g of cesium carbonate and 50 ml of water was dropped to the reaction solution with stirring at room temperature, and then, 0.2 g (0.170 mmol) of tetrakis(triphenylphosphine)palladium(0) was added to the solution. Then, the reaction solution was heated to 77° C. and stirred at this temperature (77° C.) for 5 hours. After the completion of the reaction, an organic layer was extracted with toluene and dried over anhydrous sodium sulfate, and thereafter, the solvent was distilled off under reduced pressure to afford a crude product. Next, the crude product was purified by silica gel column chromatography (developing solvent: heptane/toluene mixed solvent) to afford 0.82 g (yield: 60.8%) of Exemplary compound 1 as a yellowish-white solid.

According to matrix-assisted laser desorption/ionization-time-of-flight mass spectrometry (MALDI-TOF MS), 896 that is $M^+$ of Exemplary compound 1 was confirmed.

Further, the structure of Exemplary compound 1 was confirmed by $^1$H-NMR measurement.

$^1$H-NMR (CDCl$_3$, 400 MHz) σ (ppm): 7.76-7.73 (m, 2H), 7.63 (s, 1H), 7.57 (d, 1H), 7.48-7.44 (m, 3H), 7.36-7.30 (m, 2H), 7.20 (s, 1H), 7.12 (d, 2H), 7.03-6.92 (m, 12H), 6.84 (dd, 4H), 2.27 (s, 6H), 2.20 (s, 12H), 2.16 (s, 12H), 1.52 (s, 6H)

Synthesis Example 2

Synthesis of Exemplary Compound 2

Exemplary compound 2 was synthesized by the following synthesis scheme.

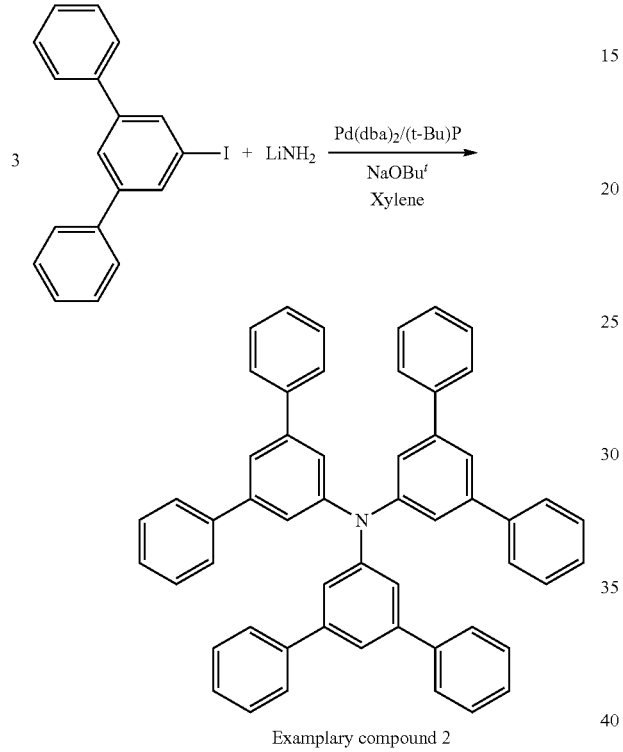

Examplary compound 2

The following reagents and solvent were charged into a 300-ml three-necked flask.
3'-Iodo-1,1':5',1"-terphenyl: 4 g (purity: 93%, 10.5 mmol)
Lithium amide (trade name, manufactured by Kishida Chemical Co., Ltd.): 2.68 g (111 mmol)
Sodium tert-butoxide (trade name, manufactured by Tokyo Chemical Industry Co., Ltd.): 3.41 g (34.8 mmol)
Xylene: 150 ml Next, after the atmosphere in the reaction system was replaced with nitrogen, 3.7 ml (0.15 mmol) of tri-tert-butylphosphine (10% by weight hexane solution) were added to the reaction solution with stirring at room temperature. Then, 0.37 mg (0.65 mmol) of palladium dibenzylideneacetone (trade name, manufactured by Tokyo Chemical Industry Co., Ltd.) was added. Then, argon was introduced into the flask to replace the reaction system with argon. After that, the reaction solution was stirred for 6 hours with heating and reflux. After the completion of the reaction, an organic layer in the reaction solution was collected with toluene. Then, the organic layer was washed with water and dried over anhydrous sodium sulfate, and the solvent was distilled off under reduced pressure to afford a crude product. Next, the crude product was purified by silica gel column chromatography (developing solvent: heptane/toluene mixed solvent) three times to afford 0.4 g (yield: 16%) of Exemplary compound 2 as a white crystal.

According to matrix-assisted laser desorption/ionization-time-of-flight mass spectrometry (MALDI-TOF MS), 701 that is M$^+$ of Exemplary compound 2 was confirmed.
Further, the structure of Exemplary compound 2 was confirmed by $^1$H-NMR measurement.
$^1$H-NMR (CDCl$_3$, 400 MHz (measurement with ECA-400 manufactured by JEOL Ltd.)) σ (ppm): 7.60-7.58 (4H, m), 7.52 (1.1H, t), 7.48 (2H, d), 7.40 (4H, dt), 7.32 (2H, tt)

Synthesis Example 3

Synthesis of Exemplary Compound 3

Exemplary compound 3 was synthesized by the following synthesis scheme.

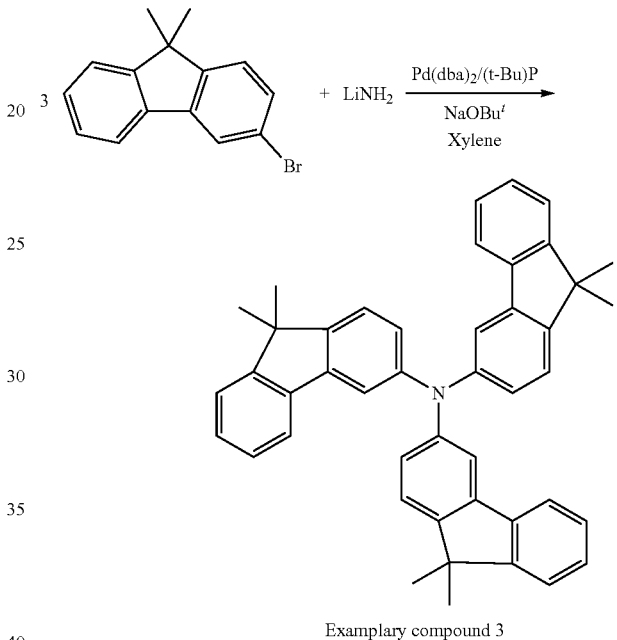

Examplary compound 3

The following reagents and solvent were charged into a 100-ml three-necked flask.
3-Bromofluorene: 0.40 g (1.46 mmol)
Lithium amide (trade name, manufactured by Kishida Chemical Co., Ltd.): 0.35 g (14.6 mmol)
Sodium tert-butoxide (trade name, manufactured by Tokyo Chemical Industry Co., Ltd.): 0.49 g (5.0 mmol)
Xylene: 20 ml Next, 0.5 ml (0.15 mmol) of tri-tert-butylphosphine (10% by weight hexane solution) was added to the reaction solution with stirring at room temperature under a nitrogen atmosphere. Then, 0.67 mg (0.153 mmol) of palladium dibenzylideneacetone (trade name, manufactured by Tokyo Chemical Industry Co., Ltd.) was added. Then, argon was introduced into the flask to replace the reaction system with argon. After that, the reaction solution was stirred for 6 hours with heating and reflux. After the completion of the reaction, an organic layer in the reaction solution was collected with toluene. Then, the organic layer was washed with water and dried over anhydrous sodium sulfate, and the solvent was distilled off under reduced pressure to afford a crude product. Next, the crude product was purified by silica gel column chromatography (developing solvent: heptane/toluene mixed solvent) to afford 0.14 g (yield: 50.0%) of Exemplary compound 3 as a white crystal.

According to matrix-assisted laser desorption/ionization-time-of-flight mass spectrometry (MALDI-TOF MS), 593.0 that is M$^+$ of Exemplary compound 3 was confirmed.

Further, the structure of Exemplary compound 3 was confirmed by $^1$H-NMR measurement.

$^1$H-NMR (CDCl$_3$, 400 MHz (measurement with ECA-400 manufactured by JEOL Ltd.)) u (ppm): 7.56 (2H, dt), 7.42 (1H, dd), 7.32-7.25 (3H, m), 7.10 (1H, dd), 1.52 (6H, s)

Measurement and evaluation of ionization potential, etc. Exemplary compounds 1 to 3 synthesized in Synthesis Examples 1 to 3 above, and α-NPD described later were evaluated for ionization potential, etc. by the following method.

(1) Energy Gap

The UV-visible absorption spectrum of a target compound formed into a thin film was measured using a spectrophotometer U-3010 manufactured by Hitachi Ltd. The thin film was obtained by forming a target compound into a film on a glass substrate. Next, an energy gap was determined from an absorption end of the measured UV-visible absorption spectrum.

(2) Ionization Potential

An ionization potential was measured using photoelectron spectroscopy (measurement device name AC-1 manufactured by Rikenkiki Co., Ltd.) in the atmosphere.

(3) Electron Affinity

An electron affinity was calculated by the following calculation equation:

[Electron affinity]=[Ionization potential]−[Energy gap]

(4) Absorption Spectrum of Radical Cation

The absorption spectrum of a radical cation was measured and evaluated using the following analytical equipment.

Electrochemical analyzer (potentiostat): 660 C manufactured by ALS

Light source for measurement of an absorption spectrum: deuterium tungsten halogen light source DH-2000 manufactured by Ocean Optics Spectroscope for measurement of an absorption spectrum: USB-2000 manufactured by Ocean Optics First, a target compound was mixed with an electrolyte solvent. Then, a voltage was applied to the mixed solution by a potentiostat to oxidize the target compound, and the absorption spectrum thereof was measured. The concentration of the target compound in the mixed solution was $1\times10^{-2}$ to $1\times10^{-5}$ mol/l. For measurement of the absorption spectrum, a potential for oxidizing the target compound was applied to the mixed solution to measure a change with time of the absorption spectrum. The absorption spectrum obtained by the measurement was a sum of the absorption spectra in a neutral state and a radical cation state. As the generated amount of radical cations can be estimated from an electrification charge amount (amperometry), the absorption spectrum in a radical cation state can be extracted from the presence ratio between neutral molecules and radical cations and the absorption spectra of both the neutral molecules and the radical cations.

FIGS. 2 to 5 each represent diagrams illustrating UV-visible absorption spectra in a neutral state and a cation excited state of Exemplary compounds 1 to 3 and α-NPD. In each of FIGS. 2 to 5, a UV-visible absorption spectrum in a neutral state is represented by 1, and a UV-visible absorption spectrum in a cation excited state is represented by 2.

Example 1

An organic light emitting device in which an anode, a hole transport layer, an emission layer, an electron transport layer, and a cathode were laminated on a substrate in this order was produced by the following method.

(1) Used Compounds and Synthesis Methods Therefor

Parts of the compounds used as constituent materials for any one of the hole transport layer, the emission layer, and the electron transport layer in this example are shown below.

Compound A1

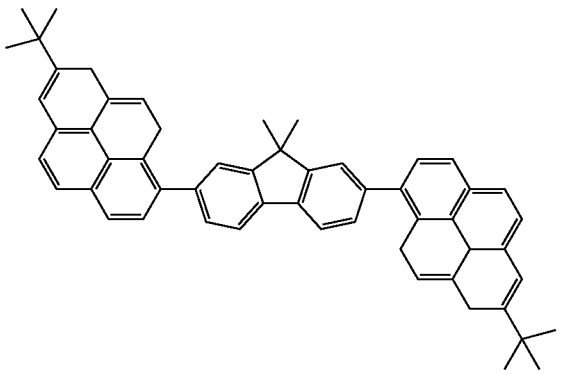

Compound A2

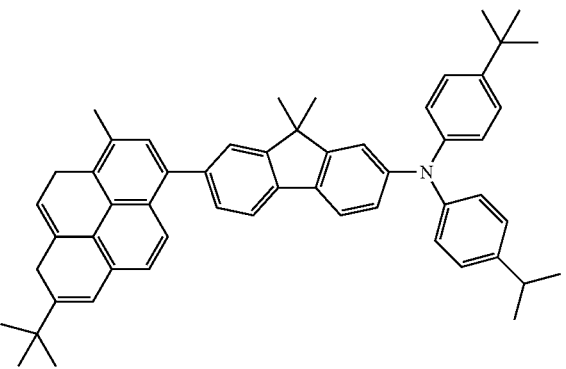

Compound A3

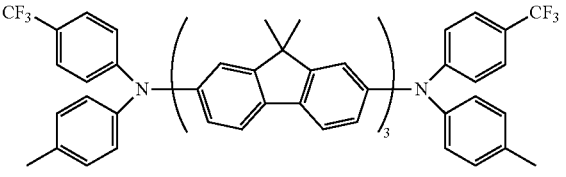

Exemplary compound 1

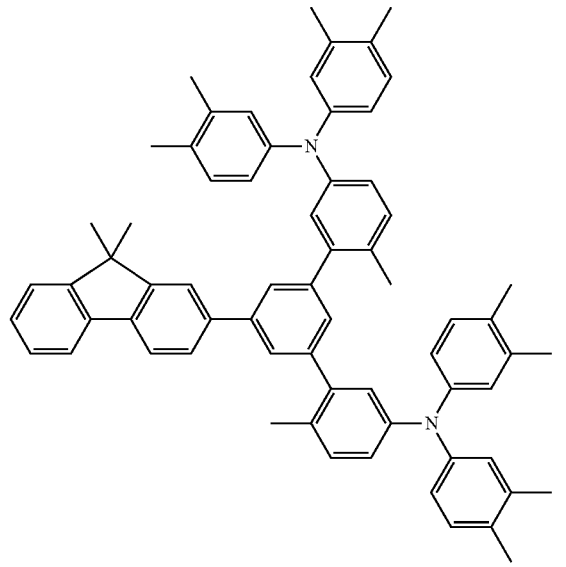

Exemplary compound 2

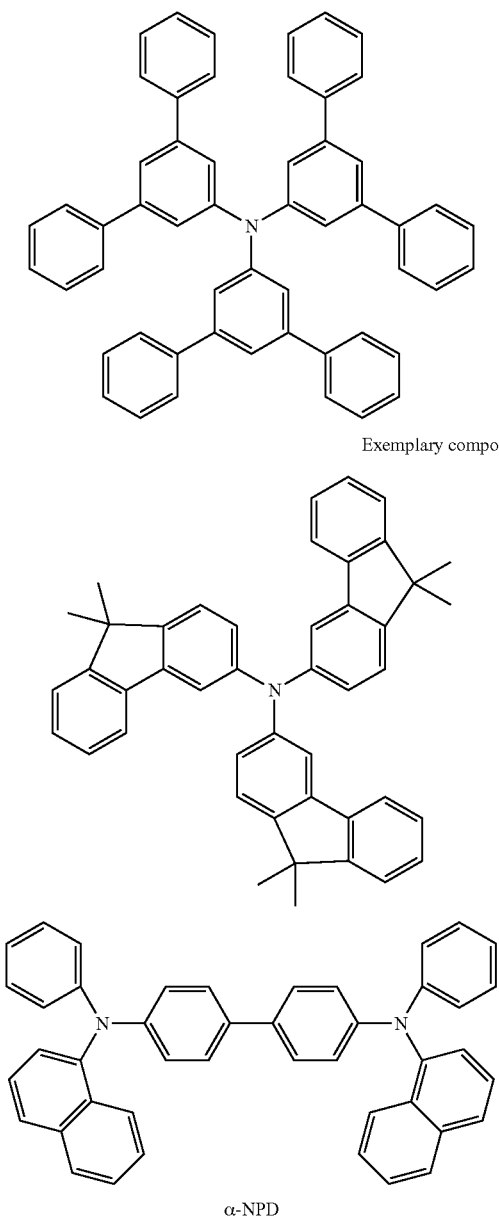

Exemplary compound 3

α-NPD

Hereinafter, the synthesis methods for the compounds used in this example are shown below.

(i) Compound A1 (Host)

Compound A1 was synthesized by the following synthesis scheme.

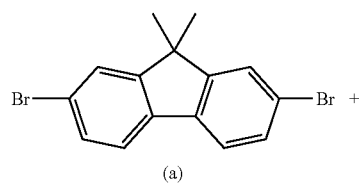

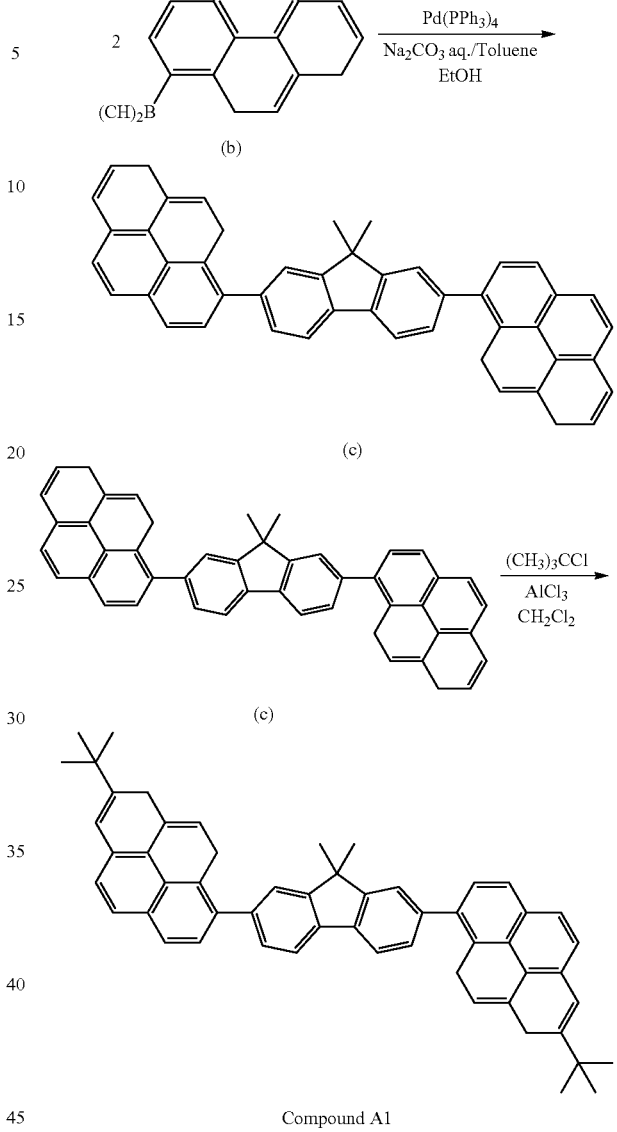

Compound A1

(i-1) The following reagents and solvents were charged into a 500-ml three-necked flask.

2,7-Dibromo-9,9-dimethylfluorene (Compound a): 2.0 g (5.68 mmol)

Pyrene-1-boronic acid (Compound b): 4.2 g (17.0 mmol)

Toluene: 120 ml

Ethanol: 60 ml

Next, after the atmosphere in the reaction system was replaced with nitrogen, an aqueous solution of a mixture of 24 g of sodium carbonate and 120 ml of water was dropped to the reaction solution with stirring at room temperature, and then, 0.33 g (0.28 mmol) of tetrakis(triphenylphosphine)palladium(0) was added to the solution. Then, the reaction solution was stirred at room temperature for 30 minutes, heated to 77° C., and stirred at this temperature (77° C.) for 5 hours. After the completion of the reaction, an organic layer was extracted with chloroform and dried over anhydrous sodium sulfate, and thereafter, the solvent was distilled off under reduced pressure to afford a crude product. Next, the crude product was purified by silica gel column chromatography (developing solvent: hexane/toluene mixed solvent) to afford 3.0 g (yield: 89.0%) of Compound c as a white crystal.

(i-2) The following reagents and solvent were charged into a 500-ml three-necked flask.

Compound c: 3.51 g (5.89 mmol)
tert-Butyl chloride: 1.64 g (17.67 mmol)
Dichloromethane: 200 ml Next, after the reaction solution was cooled to 0° C., 1.71 g (13.0 mmol) of aluminum chloride were added to the solution in small amounts with stirring at this temperature (0° C.). Then, the reaction solution was stirred at this temperature (0° C.) for 30 minutes, and thereafter, heated to room temperature and stirred for further 5 hours. After the completion of the reaction, the reaction solution was poured to 200 ml of water, and then, an organic layer was extracted with chloroform and dried over anhydrous sodium sulfate. Next, the solvent was distilled off under reduced pressure to afford a crude product. The crude product was purified by silica gel chromatography (developing solvent: hexane/toluene mixed solvent) to afford 3.53 g (yield: 84%) of Compound A1 as a white crystal.

(ii) Compound A2 (light emitting dopant) Compound A2 was synthesized by the following synthesis scheme.

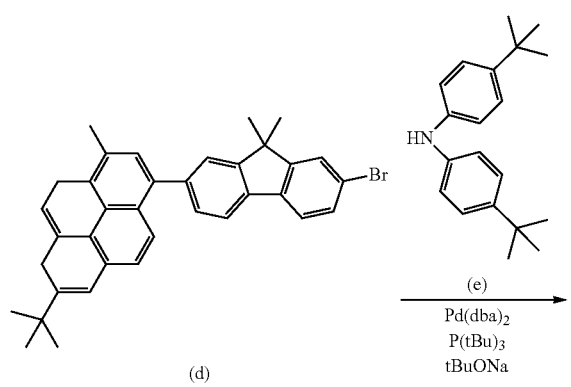

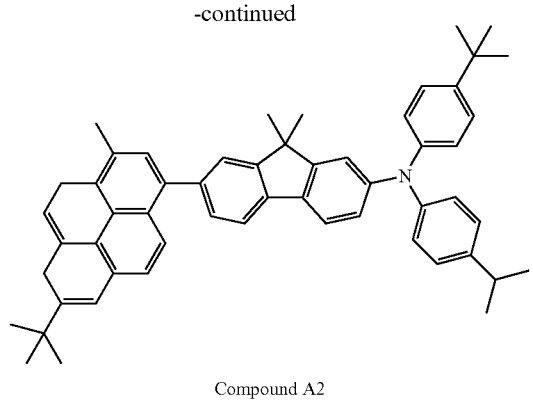

Compound A2

The following reagents and solvent were charged into a 200-ml three-necked flask.

Compound d: 0.924 g (1.70 mmol)
Compound e: 0.957 g (3.40 mmol)
Sodium tert-butoxide: 0.65 g (6.80 mmol)
Xylene: 100 ml Next, after the atmosphere in the reaction system was replaced with nitrogen, the following reagents were sequentially added to the reaction solution with stirring at room temperature.

Tri-(tert-butyl)phosphine: 34.4 mg (0.17 mmol) Palladium dibenzylideneacetone: 48.9 mg (0.085 mmol)

Next, the reaction solution was heated to 125° C., and stirred at this temperature (125° C.) for 3 hours. After the completion of the reaction, an organic layer was extracted with toluene and dried over anhydrous sodium sulfate. Next, the solvent was distilled off under reduced pressure to afford a crude product. The crude product was purified by silica gel chromatography (developing solvent: hexane/toluene mixed solvent) to afford 0.920 g (yield: 72.7%) of Compound A2 as a yellowish-white crystal.

According to mass spectrometry, 743.5 that is M+ of the compound was confirmed. Further, according to differential scanning calorimetry (DSC), the melting point of the compound was determined to be 323° C.

(iii) Compound A3 (hole transporting material) Compound A3 was synthesized by the following synthesis scheme.

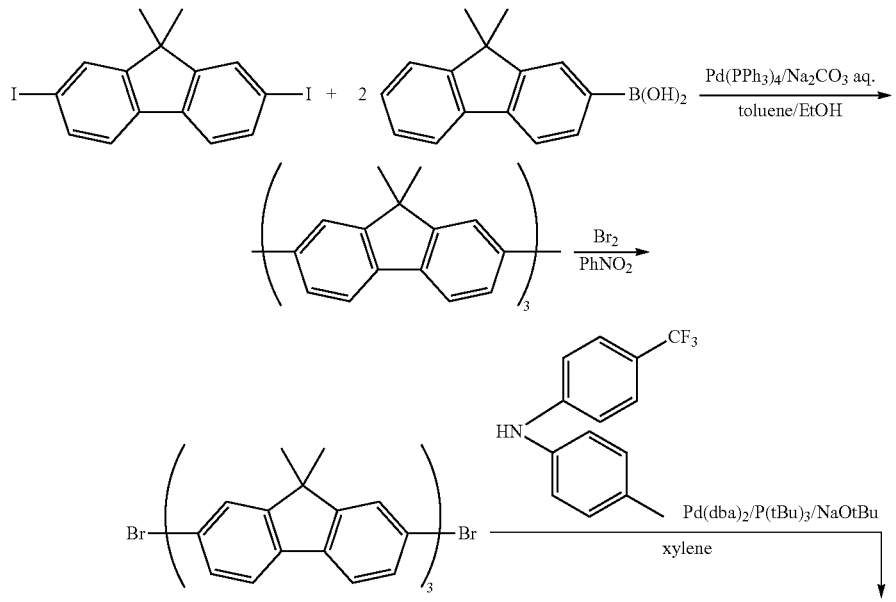

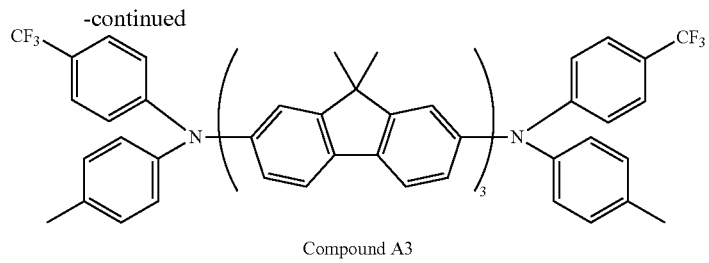

Compound A3

(iii-1) The following reagents and solvents were charged into a reaction container while the reaction system being kept under a nitrogen atmosphere by introducing nitrogen into the reaction container.
2,7-Diiodo-9,9-dimethylfluorene: 5 g (11.2 mmol)
9,9-Dimethylfluorene-2-boronic acid: 9 g (24.7 mmol)
Toluene (degassed): 200 ml
Ethanol: 100 ml Next, 245 ml of a sodium carbonate aqueous solution prepared by mixing 51 g of anhydrous sodium carbonate with 250 ml of water were dropped to the reaction solution with stirring at room temperature. Then, the reaction solution was stirred at room temperature for 30 minutes, and then, 142 g (1.23 mmol) of tetrakis(triphenylphosphine)palladium were added to the solution. Then, the reaction solution was heated and stirred for about 3 hours while the reaction container being heated on an oil bath heated to 80° C. After the reaction solution was returned to room temperature, 100 ml of water and 100 ml of ethyl acetate were added to the solution. Then, the solution was separated into a water layer and an organic layer by solvent extraction (first solvent extraction) to collect the organic layer. Then, toluene and ethyl acetate were added to the water layer, and the resultant solution was separated into a water layer and an organic layer by solvent extraction (second solvent extraction) to collect an organic layer. Then, the organic layers collected in the first and second solvent extractions were dried over sodium sulfate. Next, the solvent was distilled off under reduced pressure to afford a crude product. The crude product was purified by silica gel column chromatography (developing solvent: toluene:heptane=1:2) to afford 4.9 g of 2,2':7',2''-tris(9,9-dimethylfluorene).

(iii-2) The following reagent and solvent were charged into a reaction container while the reaction system being kept under a nitrogen atmosphere by introducing nitrogen into the reaction container. The following reagent and solvent were mixed while the reaction container being heated.
2,2':7',2''-Tris(9,9-dimethylfluorene): 4.5 g (7.79 mmol)
Nitrobenzene: 150 ml Next, 2.5 g (15.6 mmol) of bromine were dropped slowly to the reaction solution while the reaction container being heated on an oil bath heated to 60° C., followed by further stirring for about 2 hours. Then, the reaction container was transferred to an ice bath. The reaction solution was stirred for a while with cooling, and then, a precipitate was filtered. The precipitate was recrystallized from toluene, followed by filtration and drying, to afford 3.4 g of 7,7''-dibromo-2,2':7',2''-tris(9,9-dimethylfluorene).

(iii-3) The following reagents and solvent were charged into a reaction container while the reaction system being kept under a nitrogen atmosphere by introducing nitrogen into the reaction container.
Palladium bis(benzylideneacetone): 156 mg (0.272 mmol) Tri-tert-butylphosphine: 330 mg (1.63 mmol)
Xylene: 20 ml Next, the reaction solution was stirred at room temperature for 15 minutes. Then, a xylene solution prepared by mixing 50 ml of xylene with 1 g (1.36 mmol) of 7,7''-dibromo-2,2':7',2''-tris(9,9-dimethylfluorene) was dropped to the xylene solution. The reaction solution was stirred for 30 minutes while the reaction container being heated on an oil bath heated to 50° C. Then, a xylene solution prepared by mixing 1.08 g (4.08 mmol) of N-(4-trifluoromethylphenyl)-N-(4-methylphenyl)amine with 20 ml of xylene was dropped to the reaction solution. Then, 588 mg (6.12 mmol) of sodium tert-butoxide were added to the reaction solution. Next, the reaction container was heated and stirred for about 5 hours on an oil bath heated to 130° C. The reaction solution was returned to room temperature, and thereafter, 50 ml of water were added to the solution. The resultant reaction solution was separated into a water layer and an organic layer by first solvent extraction. Then, toluene and ethyl acetate were added to the water layer, and the resultant solution was separated into a water layer and an organic layer by second solvent extraction. Next, the organic layers collected in the first and second solvent extractions were dried over magnesium sulfate. The solvent was distilled off under reduced pressure to afford a crude product. The crude product was purified by silica gel column chromatography (toluene:heptane=1:2) to afford 1.2 g of Compound A3.

According to matrix-assisted laser desorption/ionization-time-of-flight mass spectrometry (MALDI-TOF MS), 1076 that is $M^+$ of Compound A3 were confirmed.

(2) Method of Manufacturing Organic Light Emitting Device

First, an indium tin oxide (ITO) was formed into a film on a glass substrate (substrate) to form an anode by sputtering. The thickness of the anode was set to 120 nm. Then, the substrate on which the anode was formed was washed ultrasonically successively with acetone and isopropyl alcohol (IPA), and washed by boiling with IPA, followed by drying. Then, the substrate was washed with UV/ozone. The substrate thus treated was used as a transparent conductive support substrate for manufacturing an organic light emitting device.

Next, Compound A3 (ionization potential: 5.85 eV) and Exemplary compound 1 (ionization potential: 5.46 eV) were mixed so as to have a mass ratio of 10:1. Then, the mixture was mixed with chloroform to prepare a 1% by weight chloroform solution. Next, the anode was spin-coated with the chloroform solution by dropping the chloroform solution to the anode first at a rotation number of 500 RPM for 10 seconds, and then, at a rotation number of 1000 RPM for 40 seconds to form a thin film serving as a hole transport layer. The thickness of the hole transport layer was 11 nm.

Next, Compound A1 as a host and Compound A2 as a light emitting dopant were co-deposited from the vapor on the hole transport layer by vacuum deposition so that the concentration of Compound A2 in the layer was 5% by weight to form an emission layer. The thickness of the emission layer was set to 100 nm, and the film formation speed of the host and the dopant were set to 0.1 nm/sec and 0.01 nm/sec, respectively, and the vacuum degree during vapor deposition was set to $5.0 \times 10^{-5}$ Pa.

Next, bathophenanthroline (BPhen) manufactured by NARD institute Ltd. was formed into a film on the emission layer by vacuum deposition to form an electron transport layer. The thickness of the electron transport layer was set to 20 nm, the vacuum degree during vapor deposition was set to $5.0 \times 10^{-5}$ Pa, and the film formation speed was set to 0.1 nm/sec.

Next, a deposition material formed of an aluminum-lithium alloy (lithium concentration: 1 at %) was formed into a film on the electron transport layer by vacuum deposition to form an alloy thin film. The thickness of the alloy thin film was set to 0.5 nm. Then, aluminum was formed into a film on the alloy thin film formed previously by vacuum deposition to form an Al thin film. The thickness of the Al thin film was set to 150 nm. The metal thin film and the Al thin film function as an electron injection electrode (cathode). Further, when the metal thin film and the Al thin film were formed, the vacuum degree during vapor deposition was set to $5.0 \times 10^{-5}$ Pa, and the film formation speed was set to 1.0 to 1.2 nm/sec.

Next, the device thus obtained was covered with a protective glass plate in a nitrogen atmosphere and sealed with an epoxy resin-based adhesive so that the device does not adsorb moisture to decrease the emission intensity thereof. The adhesive surface of the used protective glass is provided with a sheet for water adsorption (moisture target sheet for organic EL manufactured by Dynic Co., Ltd.).

Accordingly, the organic light emitting device was obtained.

When a current was applied to the device thus obtained, the device exhibited a blue emission. The maximum emission wavelength of the blue color was 460 nm. Further, the life of the device was evaluated by applying a voltage to the device continuously while keeping a current at 33 mA/cm². Specifically, the half-life of the initial luminance caused by the continuous application of a voltage was evaluated. Table 3 shows the results.

Example 2

An organic light emitting device was produced by the same method as that of Example 1, except for using Exemplary compound 2 (ionization potential: 5.72 eV) in place of Exemplary compound 1 as the constituent material for the hole transport layer. The device thus obtained was evaluated in the same way as in Example 1. Table 3 shows the results.

Example 3

An organic light emitting device was produced by the same method as that of Example 1, except for using Exemplary compound 3 (ionization potential: 5.51 eV) in place of Exemplary compound 1 as the constituent material for the hole transport layer. The device thus obtained was evaluated in the same way as in Example 1. Table 3 shows the results.

Comparative Example 1

An organic light emitting device was produced by the same method as that of Example 1, except for using α-NPD (ionization potential: 5.40 eV) represented by the following formula in place of Exemplary compound 1 as the constituent material for the hole transport layer. The device thus obtained was evaluated in the same way as in Example 1. Table 3 shows the results.

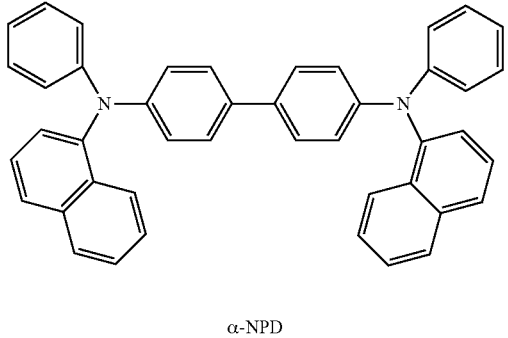 [SMILES: c1ccc(N(c2ccc(-c3ccc(N(c4ccccc4)c4cccc5ccccc45)cc3)cc2)c2cccc3ccccc23)cc1]

α-NPD

TABLE 3

| | Compound having the smallest ionization potential | Half-life of initial luminance |
|---|---|---|
| Example 1 | Exemplary compound 1 | 25.5 |
| Example 2 | Exemplary compound 2 | 46.3 |
| Example 3 | Exemplary compound 3 | 69.4 |
| Comparative Example 1 | α-NPD | 6.9 |

It is understood from Table 3 that the organic light emitting devices of Examples 1 to 3 were enhanced remarkably in half-life of initial luminance, compared with the device of Comparative Example 1. This is probably because, when α-NPD used in Comparative Example 1 incorporates holes to enter a radical cation state, α-NPD absorbs a part of energy of a blue emission emitted from the emission layer, resulting in a change in structure of the compound itself. On the other hand, it is considered that, when Exemplary compounds 1 to 3 used in Examples 1 to 3, respectively, incorporate holes to enter a radical cation state, changes in structure as seen in α-NPD do not occur.

Figure 2:
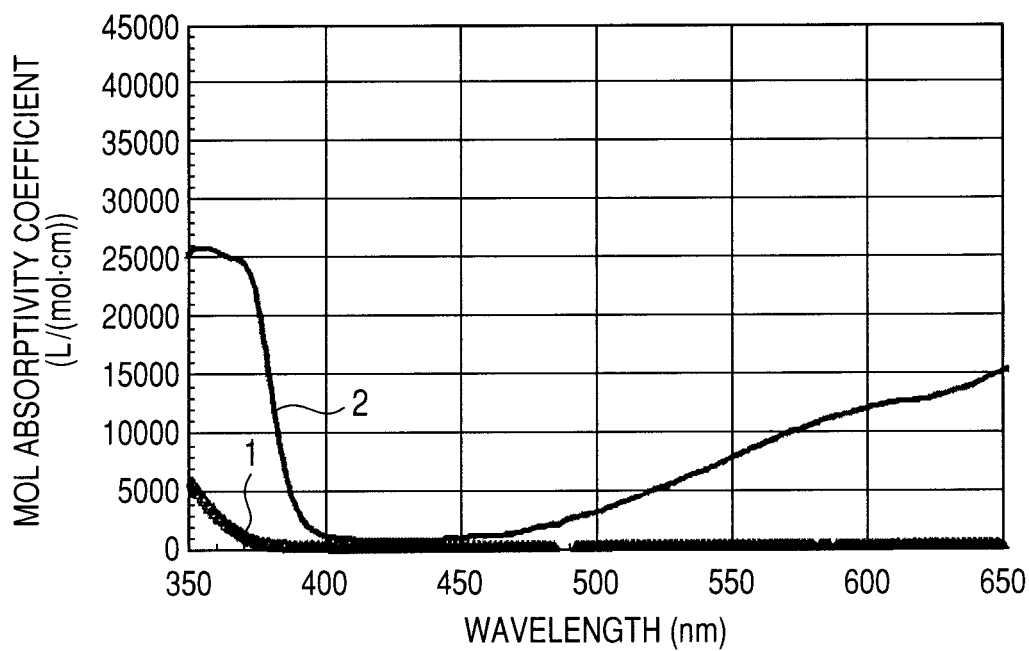
FIG. 2 is a diagram illustrating UV-visible absorption spectra of Exemplary compound 1 in a neutral state and a radical cation state.
Figure 3:
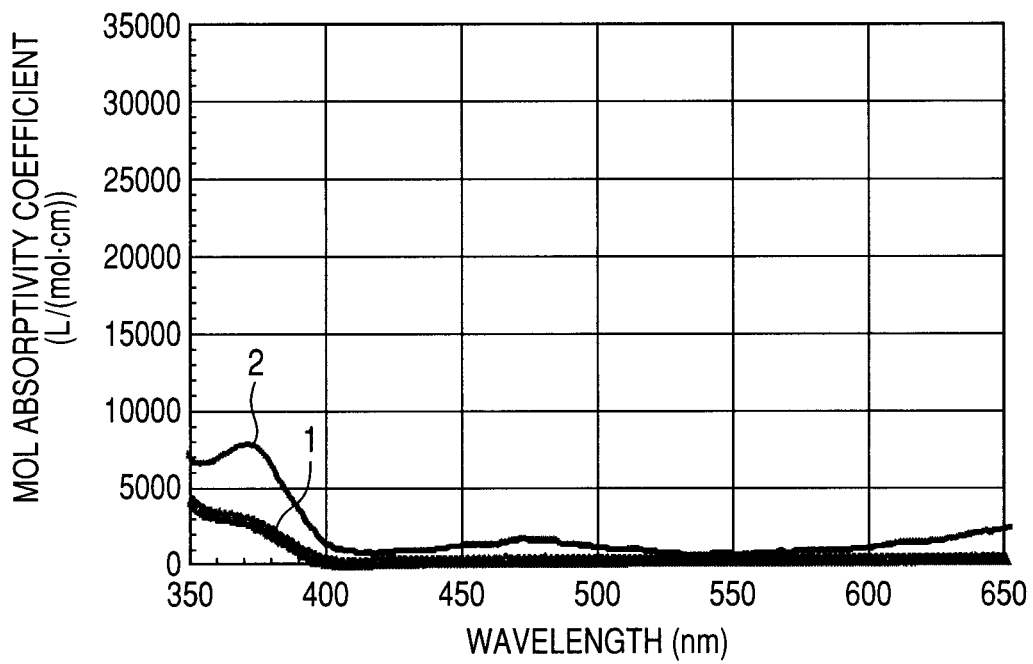
FIG. 3 is a diagram illustrating UV-visible absorption spectra of Exemplary compound 2 in a neutral state and a radical cation state.
Figure 4:
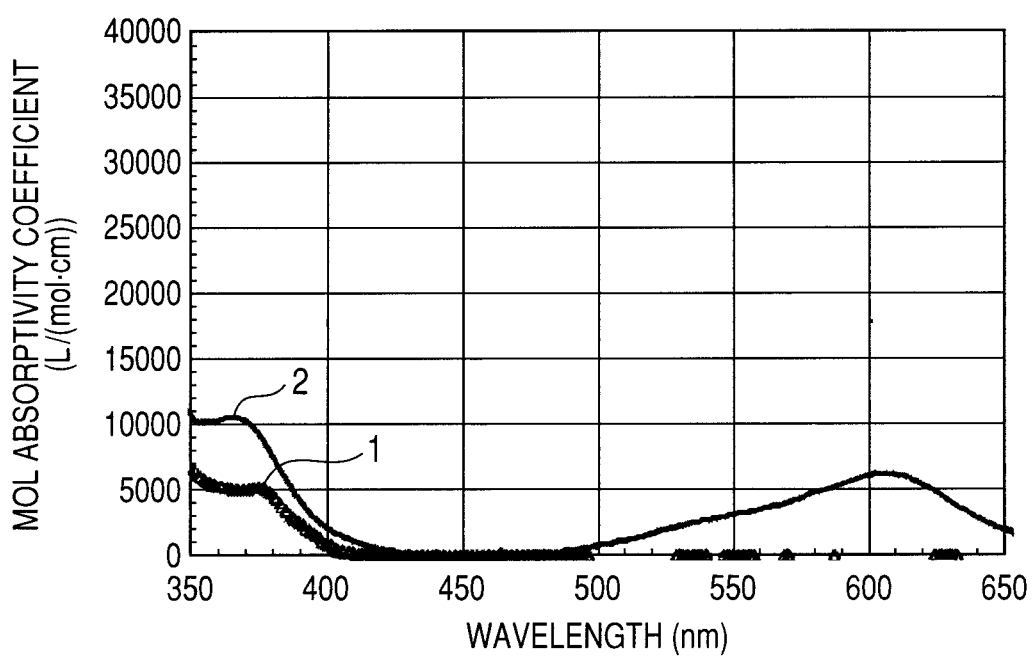
FIG. 4 is a diagram illustrating UV-visible absorption spectra of Exemplary compound 3 in a neutral state and a radical cation state.
Figure 5:
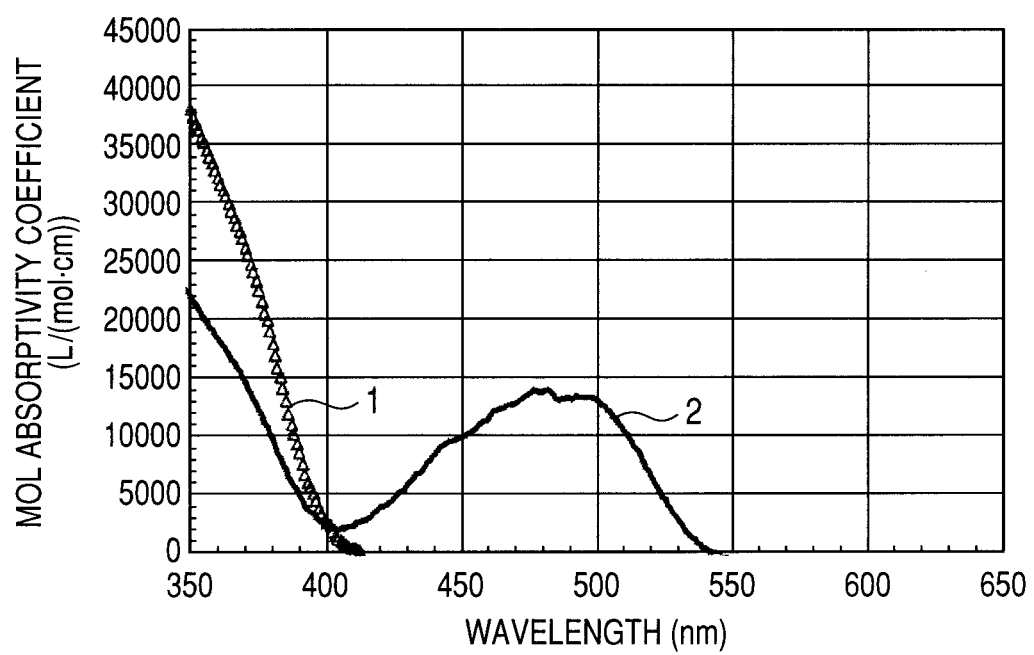
FIG. 5 is a diagram illustrating UV-visible absorption spectra of α-NPD in a neutral state and a radical cation state.

As illustrated in FIGS. 2 to 4, Exemplary compounds 1 to 3 have no absorption peak in a blue color wavelength region (410 nm to 490 nm) in a radical cation state. On the other hand, as illustrated in FIG. 5, α-NPD has an absorption peak in a blue color wavelength region (410 nm to 490 nm) in a radical cation state.

As described above, the organic light emitting devices of Examples 1 to 3 are enhanced in durability during continuous driving.

INDUSTRIAL APPLICABILITY

According to the present invention, the organic light emitting device with enhanced durability during continuous driving can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-282648, filed Dec. 14, 2009, which is hereby incorporated by reference herein in its entirety.

The invention claimed is:

1. An organic light emitting device comprising:
an anode;
a cathode; and
an organic compound layer being placed between the anode and the cathode and including at least a hole transport layer and an emission layer,
wherein the emission layer contains a light emitting material which emits light including light in the blue color wavelength region;
wherein the hole transport layer contains a first organic compound and a second organic compound;
wherein an ionization potential of the second organic compound is smaller than that of the first organic compound;
wherein the second organic compound in a radical cation state has no absorption spectrum peak in the blue color wavelength region; and
wherein concentration of the second organic compound is 5% by weight or more to 30% by weight or less of the hole transport layer.

2. The organic light emitting device according to claim 1, wherein a mole absorptivity coefficient of the second organic compound in the blue color wavelength region is 5000 $L \cdot mol^{-1} \cdot cm^{-1}$ or less.

3. The organic light emitting device according to claim 1, wherein the second organic compound is represented by the following general formula (1):

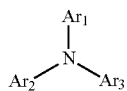

(1)

where $Ar_1$ to $Ar_3$ each represent a fused polycyclic aromatic group or a substituted phenyl group represented by the following general formula (2):

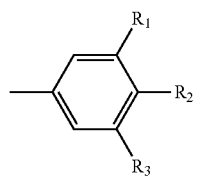

(2)

provided that each of $Ar_1$ to $Ar_3$ may be the same as or different from the other substituents,
where $R_1$ and $R_3$ each represent a hydrogen atom, a halogen atom, a substituted or unsubstituted alkyl group, or a substituted or unsubstituted aryl group, provided that any one of $R_1$ and $R_3$ represents a substituted or unsubstituted aryl group; and $R_2$ represents a hydrogen atom, a halogen atom, or a substituted or unsubstituted alkyl group.

4. A display apparatus comprising pixels comprising the organic light emitting device according to claim 1 and a TFT circuit that controls luminance of the organic light emitting device.

5. The organic light emitting device according to claim 1, wherein the emission layer does not contain the second organic compound.

6. The organic light emitting device according to claim 5, wherein the emission layer comprises a host and a guest.

7. The organic light emitting device according to claim 1, wherein the second organic compound is represented by any one of the following formulae:

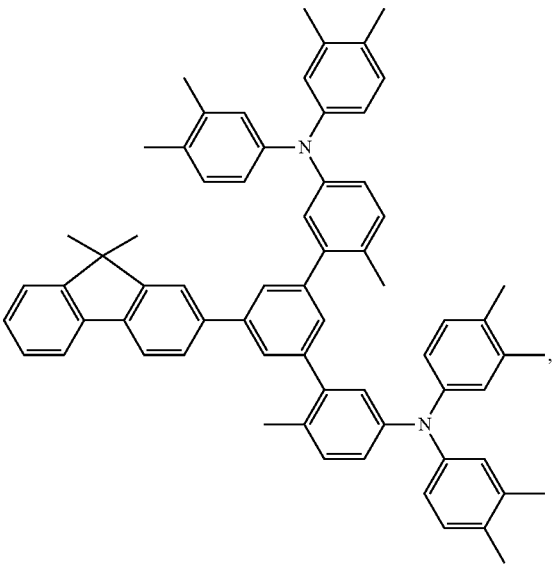

,

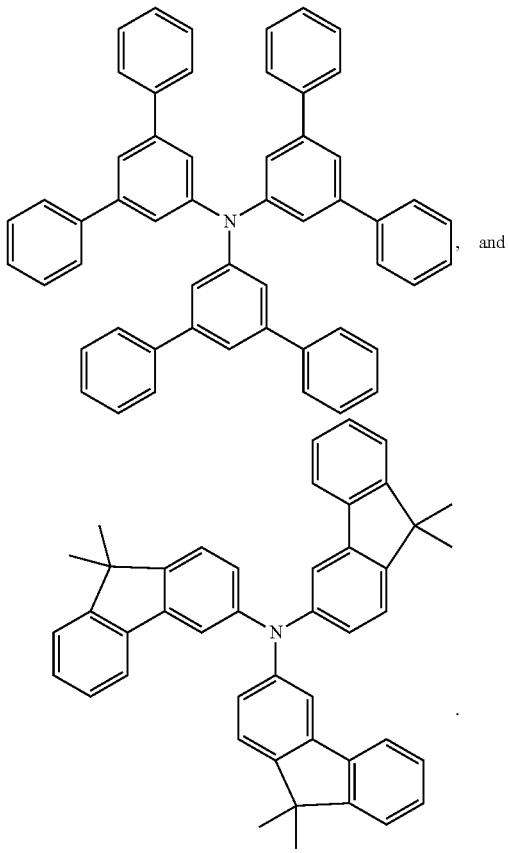

, and

8. An illumination comprising the organic light emitting device according to claim 1.

9. An electrophotographic image forming apparatus comprising a light source for forming a latent image of a photosensitive body, wherein the light source comprises the organic light emitting device according to claim 1.

* * * * *